(12) United States Patent
Kosemura

(10) Patent No.: US 6,330,377 B1
(45) Date of Patent: Dec. 11, 2001

(54) OPTICAL TRANSMITTING/RECEIVING METHOD AND APPARATUS

(75) Inventor: Takahiko Kosemura, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/385,401

(22) Filed: Aug. 30, 1999

(30) Foreign Application Priority Data

Sep. 7, 1998 (JP) ................................. P10-252416

(51) Int. Cl.⁷ ...................................................... G02B 6/12
(52) U.S. Cl. .................................. 385/14; 385/31; 385/47
(58) Field of Search ................................ 385/14, 31–33, 385/47–49, 15

(56) References Cited

U.S. PATENT DOCUMENTS

| | | | |
|---|---|---|---|
| 3,663,194 | * | 5/1972 | Greenstein et al. ................. 65/43 |
| 4,070,516 | * | 1/1978 | Kaiser ............................... 428/137 |
| 4,268,113 | * | 5/1981 | Noel, Jr. ............................. 385/92 |
| 4,727,649 | * | 3/1988 | Nishizawa ........................... 29/840 |
| 4,772,787 | * | 9/1988 | Trommer ........................ 250/227.29 |
| 4,945,400 | * | 7/1990 | Blonder et al. .................... 257/116 |
| 5,073,003 | * | 12/1991 | Clark ................................ 385/33 |
| 5,200,631 | * | 4/1993 | Austin et al. ...................... 257/81 |
| 5,247,596 | * | 9/1993 | Maignan et al. .................... 385/88 |
| 5,357,103 | * | 10/1994 | Sasaki ........................... 250/227.24 |
| 5,390,271 | * | 2/1995 | Priest ............................... 385/92 |
| 5,392,368 | * | 2/1995 | Schiltz .............................. 385/14 |
| 5,400,419 | * | 3/1995 | Heinen ............................. 385/14 |
| 5,446,814 | * | 8/1995 | Kuo et al. ......................... 385/31 |
| 5,911,022 | * | 6/1999 | Plickert et al. .................... 385/49 |
| 6,090,636 | * | 7/2000 | Geusic et al. ..................... 438/31 |

FOREIGN PATENT DOCUMENTS 04-249205-A * 9/1992 (JP).
06-119654-A * 4/1994 (JP).

* cited by examiner

Primary Examiner—Phan T. H. Palmer
Assistant Examiner—Michelle R. Connelly-Cushwa
(74) Attorney, Agent, or Firm—Oblon, Spivak, McClelland, Maier & Neustadt, P.C.

(57) ABSTRACT

A couple of plane type optical emitting/receiving elements are face-down mounted by the flip chip joining method on the upper surface of the multilayer substrate and the through-holes are respectively formed at the area just under the center of plane type optical emitting/receiving elements. At the internal wall of through-holes, the clad layer consisting of conductive layer where the plating process is conducted at the surface thereof is formed and the core layer consisting of the polymer resin is also formed at the center. At the lower surface of multilayer substrate, the optical waveguide extending linearly up to the area just under the other through-hole from the area just under one through-hole is formed. Moreover, the 45° micro-mirrors are respectively formed at both end faces of the optical waveguide.

13 Claims, 6 Drawing Sheets

F I G. 1
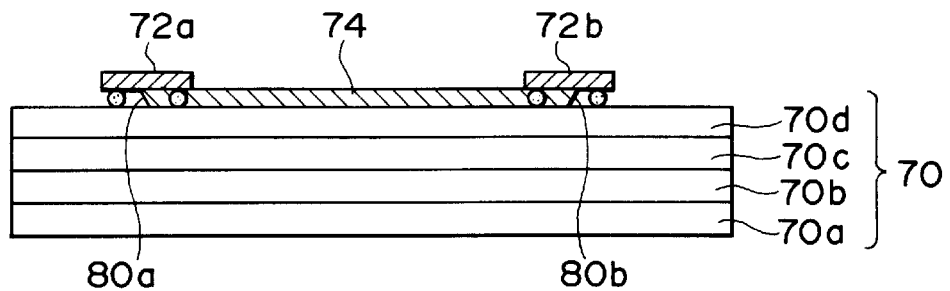
F I G. 2
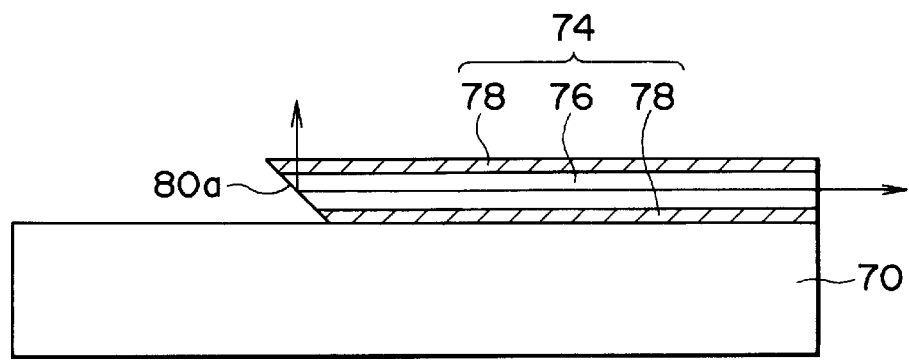
F I G. 3
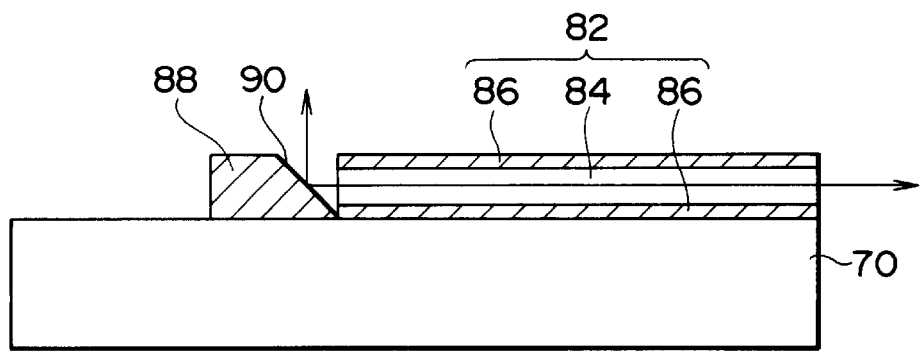

OPTICAL TRANSMITTING/RECEIVING METHOD AND APPARATUS

BACKGROUND OF THE INVENTION

1. Field of the Invention

The present invention relates to an optical transmitting/receiving method and apparatus and more particularly to an optical transmitting/receiving method and apparatus wherein optical parts and electronic parts are mounted on the same substrate.

2. Description of Related Art

With rapid progress of IC (Integrated Circuit) technology and LSI (Large Scale Integrated Circuit) technology, the operating speed and integration density of these circuits have been improved, thereby accelerating improvement in performance of MPU (Micro-Processing Unit: Microprocessor) and of operation rate and capacity of memory chip. Under the situation explained above, particularly in the case of high speed digital signal transmission and in the case where a high speed bus or the like is required between MPU and memory chip, delay by the electrical wiring and deterioration of crosstalk due to the high speed and high density transmission by signal wire have been bottle neck for realization of higher performance. As the technique for solving such problem, attention is paid to optical wiring (optical inter-connection).

This optical wiring may be thought applicable in various levels, for example, between apparatuses, boards in the apparatus, chips in the board, etc. For signal transmission in comparatively short distance, for example, between chips, an optical transmitting/receiving method using optical waveguide as the transmission path has been effective.

An example of the optical transmitting/receiving method of the related art using such optical waveguide as the transmission path will be explained with reference to FIG. 1 and FIG. 2. Here, FIG. 1 is a schematic cross-sectional view illustrating an example of the optical transmitting/receiving system of the related art of FIG. 1, while FIG. 2 is an enlarged view of optical waveguide and 45° micro-mirror of the optical transmitting/receiving method of FIG. 1.

As illustrated in FIG. 1, on the upper surface of a multilayer substrate 70 on which the first to fourth insulating layers 70a, 70b, 70c, 70d are sequentially laminated, a couple of plane type optical emitting/receiving elements 72a, 72b are face-down mounted with the flip chip joining method, namely mounted with the optical emitting/receiving surface directed downward.

Although not illustrated, a wiring layer is also formed at the upper surface and lower surface of the multilayer substrate 70 and between the first to fourth insulating layers 70a, 70b, 70c, 70d and moreover these wiring layers are connected through holes formed to the first to fourth insulating layers 70a, 70b, 70c, 70d, to form a multilayer wiring structure as a whole. Moreover, on the upper surface of multilayer substrate 70, optical emitting drive and optical receiving and amplifying circuit, LSI circuit and electronic parts such as inductor, capacitor and resistor or the like are mounted in addition to the plane type optical emitting/receiving elements 72a, 72b, utilizing the flip chip joining method and wire bonding joining method.

Moreover, on the upper surface of the multilayer substrate 70, an optical waveguide 74 is formed extending in straight up to the area just under the plane type optical emitting/receiving element 72b from the area just under the plane type optical emitting/receiving element 72a. As illustrated in FIG. 2, this optical waveguide 74 is formed of core 76 at the center for transmitting optical signal and clad 78 consisting of a material having a refraction index which is lower than that of core 76 in order to surround the core 76. Moreover, at both end faces of this optical waveguide 74, the 45° micro-mirrors 80a, 80b and formed.

In the optical transmitting/receiving method illustrated in FIG. 1 and FIG. 2 as explained above, an optical signal emitted from an optical emitting surface, for example, of the plane type optical emitting/receiving element 72a is totally reflected in 90 degrees by the 45° micro-mirror 80a located at the area just under the optical emitting surface. Thereafter, this optical signal is incident to the core 75 of the optical waveguide 74 and is then propagated within the core 76. Moreover, the optical signal propagated within the core 76 of this optical waveguide 74 is totally reflected in 90 degrees by the 45° micro-mirror 80b and thereafter it is then incident to the optical receiving surface of the plane type optical emitting/receiving element 72b located at the area just above this 45° micro-mirror 80b.

The optical signal emitted from the plane type optical emitting/receiving element 72a is then transmitted to the plane type optical emitting/receiving element 72b via the 45° micro-mirror 80a, optical waveguide 74 and 45° micro-mirror 80b. In the same manner, the optical signal emitted from the plane type optical emitting/receiving element 72b is then transmitted to the plane type optical emitting/receiving element 72a via the 45° micro-mirror 80b, optical waveguide 74 and 45° micro-mirror 80a.

In FIG. 2, the optical signal is totally reflected in 90 degrees by the 45° micro-mirror 80a and is then propagated within the core 76 of the optical waveguide 74. This profile is indicated using arrow mark as the image of optical transmission. This image of optical transmission is only tentative indication for convenience of explanation. Actually, it is a matter of course that the optical signal incident in the range of predetermined critical angle is propagated by repeating total reflection at the interface of the core 76 and clad 78 of the optical waveguide 74.

Moreover, in some cases, a very small size mirror illustrated in FIG. 3 is used in place of the 45° micro-mirrors 80a, 80b illustrated in FIG. 1 and FIG. 2. Namely, on the upper surface of the multilayer substrate 70, the optical waveguide 82 extending in straight up to the other plane type optical emitting/receiving element from one plane type optical emitting/receiving element is formed. This optical waveguide 82 is also formed of the center core 84 for transmitting optical signal and clad 86 composed of a material having the refraction index lower than that of the core 84 to surround this core 84. The small size mirror 88 is also formed on the upper surface of the multilayer substrate 70 which is neighboring to one end face of this optical waveguide 82 and is located at the area just under the optical emitting surface of one plane type optical emitting/receiving element. In addition, although not illustrated, such small size mirror is also formed on the upper surface of the multilayer substrate 70 which is neighboring to the other end face of the optical waveguide 82 and is located at the area just under the receiving surface of the other plane type optical emitting/receiving element.

In this case, the optical signal, for example, emitted from the optical emitting surface of one plane type optical emitting/receiving element is totally reflected in 90 degrees by the 45° mirror surface 90 of small size mirror 88 and thereafter the signal is then incident to the core 84 of the optical waveguide 82 and is then propagated within the core 84. Moreover, the optical signal propagated within the core 84 of the optical waveguide 82 is totally reflected in 90 degrees by the 45° mirror surface of small size mirror (not illustrated) and thereafter it is incident to the optical receiving surface of the other plane type optical emitting/receiving element located at the area just above the mirror.

Next, the other example of the optical transmitting/receiving system of related art using the optical waveguide as the transmission path will be explained with reference to FIG. 4. Here, FIG. 4 is a schematic cross-sectional view illustrating the other example of the optical transmitting/receiving system of the related art. The elements like the structural elements in the optical transmitting/receiving method illustrated in FIG. 1 are designated by the like reference numerals and the same explanation is omitted here. Moreover, an enlarged view of optical waveguide and 45° micro-mirror of the optical transmitting/receiving method of FIG. 4 are basically identical to FIG. 2. Therefore, such enlarged view is not illustrated.

As illustrated in FIG. 4, at the upper surface of the multilayer substrate 70 on which the first to fourth insulating layers 70a, 70b, 70c, 70d are sequentially laminated, the plane type optical emitting/receiving element 92 is face-down mounted by the flip chip joining method. Moreover, at the bottom surface of recessed area formed on the multilayer substrate 70, the end-face type optical emitting/receiving element 94 is mounted via the die pad with the wire bonding joining method.

In addition, on the upper surface of the multilayer substrate 70, an optical waveguide 96 extending up to the end face of the end face type optical emitting/receiving element 94 from the area just under the plane type optical emitting/receiving element 92 is also formed. At the end face in the side of the plane type optical emitting/receiving element 92 of this optical waveguide 96, the 45° micro-mirror 98 is formed.

In this optical transmitting/receiving method illustrated in FIG. 4, the optical signal emitted, for example, from the optical emitting surface of the plane type optical emitting/receiving element 92 is totally reflected in 90 degrees by the 45° micro-mirror 98 located at the area just under the optical emitting surface and thereafter propagated within the optical waveguide 96. The optical signal propagated within the optical waveguide 96 is then incident to the optical receiving surface of the end-face type optical emitting/receiving element 94.

The optical signal emitted from the plane type optical emitting/receiving element 92 as explained above is then transmitted to the end-face type optical emitting/receiving element 94 via the 45° micro-mirror 98 and optical waveguide 96. In the same manner, the optical signal emitted from the end-face type optical emitting/receiving element 94 is also transmitted to the plane type optical emitting/receiving element 92 via the optical waveguide 96 and 45° micro-mirror 98.

Here, it is also possible to use a small size mirror in place of the 45° micro-mirror 98 as explained with reference to FIG. 3. Therefore, the same figure and explanation will be omitted here.

In the optical transmitting/receiving method using the optical waveguide of the related art as the transmission path, electronic parts such as optical emitting drive and receiving circuit, LSI circuit, inductor, capacitor and resistor are mixed in mounting in addition to the plane type optical emitting/receiving elements 72a, 72b, 92 and end-face type optical emitting/receiving element 94 on the upper surface of the multilayer substrate 70 having the multilayer wiring structure. Moreover, optical wiring section such as optical waveguides 74, 96 for optically connecting the plane type optical emitting receiving elements 72a, 72b, plane type optical emitting/receiving element 92 and end-face type optical emitting/receiving element 94 and electrical joining section for mounting electronic parts by the flip chip mounting or wire bonding wiring method are also mixed in the arrangement.

As illustrated in FIG. 5, for example, on the occasion that electrical wiring sections 100a, 100b are formed on the upper and lower surfaces of the multilayer substrate 70 and the LSI circuit 102, for example, is flip-chip mounted via the flip chip bump 104 on the electrical wiring section 100a of this upper surface, a plurality of flip chip bumps 104 of the LSI circuit 102 are held by a plurality of lines of optical waveguide 106. Here, the optical waveguide 106 is formed linearly between a pair of optical emitting/receiving elements. Therefore, the optical wiring sections of optical waveguides 106 of a plurality lines extending linearly and electrical joining section of electronic parts such as LSI circuit 102 are mixed in the mounting format at a higher density.

Therefore, on the occasion that various electronic parts such as LSI circuit 102 are mounted, for example, by the flip chip joining method or wire bonding joining method on the upper surface of the multilayer substrate 70, there is a problem that degree of freedom for arrangement of electronic parts is restricted by the optical wiring section such as optical waveguide 106 of a plurality of lines extending linearly and thereby high density and highly efficient mounting can no longer be realized.

Moreover, as illustrated in FIG. 5, when the LSI circuit 102, for example, is mounted to the electrical wiring section 100a via the flip chip bump 104, a part of the surface of electrical wiring section 100a must be exposed. Therefore, the clad 110 of the optical waveguide 106 formed of the center core 108 and surrounding clad 110 must be cut and opened. For this reason, not only the manufacturing process is complicated but also reliability of optical waveguide 106, moreover, reliability of the optical transmitting/receiving method may be deteriorated.

Since the 45° micro-mirrors 80a, 80b, 98 formed at the end faces of the optical waveguides 74, 96 have the inverse trapezoidal shape in its cross-sectional view, the ordinary method for mechanically cutting the optical waveguides 74, 96 cannot be used and therefore dry-etching technique must be used. Therefore, here rises a problem that manufacturing process is complicated and manufacturing cost may also be raised.

As illustrated in FIG. 3, small size mirror 88 may also be formed adjacent to the end face of optical waveguide 82 in place of the 45° micro-mirrors 80a, 80b, 98. Even in this case, since the small size mirror 88 must be formed through accurate alignment at the area just under the plane type optical emitting/receiving elements 72a, 72b, 92, also rises a problem that manufacturing process is also complicated and manufacturing cost also rises.

SUMMARY OF THE INVENTION

The present invention has been proposed considering the problems explained above and it is therefore an object of the present invention to provide an optical transmitting/receiving system in which optical parts and electronic parts are mixed for the mounting on the same substrate to mount such optical parts and electronic parts in the higher density and efficiency.

Moreover, it is also an object of the present invention to provide an optical transmitting/receiving method which has simplified the manufacturing process of the 45° micromirror to be formed at the end face of the optical waveguide used as the transmission path of optical part and also has attained reduction in cost.

Above problems may be solved by the optical transmitting/receiving method of the present invention explained hereunder.

Namely, the optical transmitting/receiving method in relation to claim 1 comprises a substrate, through-hole provided between the upper and lower surfaces of the substrate and a couple of optical emitting/receiving elements mounted at the upper and lower surfaces of the substrate and is also characterized in using the through-hole as the transmission path for optical transmission and reception between a couple of the optical emitting/receiving elements.

In the optical transmitting/receiving method in relation to claim 1 as explained above, since a through-hole provided between the upper and lower surfaces of the substrate is used as the transmission path for optical transmission and reception between a couple of optical emitting/receiving elements, the transmission path such as optical guide may also be formed also, for example, at the lower surface of the substrate and thereby degree of freedom for variable optical wiring with simplified structure may be increased in comparison with the case where the optical wiring section is formed only on the upper surface of the substrate like the related art. Therefore, even when optical parts are mounted in higher density on the upper surface of substrate and moreover various electronic parts are mixed in mounting in the higher density, it is possible to establish optical wiring between a couple of optical emitting/receiving elements in such a manner as not interfering the high density mounting of these optical parts and electronic parts. On the contrary, such optical parts and electronic parts may be mounted in the density and efficiency higher than that of the related art by using the through-hole as the transmission path for optical transmission and reception between a couple of optical emitting/receiving elements.

The optical transmitting/receiving method in relation to claim 2 comprises a substrate, through-hole provided between the upper and lower surfaces of the substrate, first plane type optical emitting/receiving element face-down mounted on the upper surface of the substrate and located just above the through-hole, and second plane type optical emitting/receiving element face-down mounted on the lower surface of the substrate and located just under the through-hole and is also characterized in realizing optical transmission and reception between the first plane type optical emitting/receiving element and the second plane type optical emitting/receiving element via the through-hole.

In the optical transmitting/receiving method in relation to claim 2 as explained above, since it is no longer required to form optical wiring section on the upper surface of substrate by conducting transmission and reception between the couple of first plane type optical emitting/receiving element and second plane type optical emitting/receiving element mounted respectively on the upper and lower surfaces of the substrate via the through-hole provided between the upper and lower surfaces of the substrate, even when the optical parts are mounted in higher density on the upper surface of substrate or when various electronic parts are mixed in higher density, optical wiring can be made between the first plane type optical emitting/receiving element and second plane type optical emitting/receiving element in such a manner as not interfering high density mounting of optical parts and electronic parts. On the contrary, optical parts and electronic parts may be mounted in the density and efficiency higher than that of the related art by using the through-hole provided through the upper and lower surfaces of substrate as the transmission path for optical transmission and reception between the first plane type optical emitting/receiving element and second plane type optical emitting/receiving element.

The optical transmitting/receiving method in relation to claim 3 comprises a substrate, first and second through-holes provided between the upper and lower surfaces of the substrate, first plane type optical emitting/receiving element face-down mounted on the upper surface of the substrate and located at the upper surface of the first through-hole, second plane type optical emitting/receiving element face-down mounted on the upper surface of the substrate and located at the upper surface of the second through-hole, optical waveguide formed on the lower surface of the substrate and extended up to the area at the lower surface of the second through-hole from the area at the lower surface of the first through-hole, first and second optical path changing means formed respectively at both ends of the optical waveguide and also realizes optical transmission and reception between the first plane type optical emitting/receiving element and second optical emitting/receiving element via the first through-hole, the first optical path changing means, the optical waveguide, the second optical path changing means and the second through-hole.

In the optical transmitting/receiving method in relation to claim 3 as explained above, since it is no longer necessary to form optical wiring section on the upper surface of substrate by conducting optical transmission and reception between a couple of first plane type optical emitting/receiving element and second plane type optical emitting/receiving element mounted on the upper surface of substrate via the first and second through-holes provided between the upper and lower surfaces of substrate, optical waveguide formed at the lower surface of substrate extending to the area at the lower surface of the second through-hole from the area at the lower surface of the first through-hole and the first and second optical changing means formed respectively at both end faces of the optical waveguide, even when optical parts are mounted in higher density on the upper surface of substrate and when various electronic parts are further mixed for the mounting in higher density, optical wiring may be made between the first plane type optical emitting/receiving element and second plane type optical emitting/receiving element in such a manner as not interfering high density mounting of the optical parts and electronic parts. On the contrary, optical parts and electronic parts may be mounted in the density and efficiency higher than that of the related art by using the first and second through-holes provided between the upper and lower surfaces of substrate and optical waveguide formed at the lower surface of the substrate as the transmission path for optical transmission and reception between the first plane type optical emitting/receiving element and second optical emitting/receiving element.

The optical transmitting/receiving method in relation to claim 4 comprises a substrate, through-hole provided between the upper and lower surfaces of the substrate, plane type optical emitting/receiving element face-down mounted on the upper surface of the substrate and located at the upper position of the through-hole, end-face type optical emitting/receiving element mounted on the lower surface of the substrate, optical waveguide formed on the lower surface of the substrate and extended up to the end face of the end-face type optical emitting/receiving element from the area just under the through-hole, and optical path changing means formed at the end face of the optical waveguide in the side of the through-hole, and also realizes optical transmission and reception between said plane type optical emitting/receiving element and the end-face type optical emitting/receiving element via the through-hole, the optical path changing means and the optical waveguide.

In the optical transmitting/receiving method in relation to claim 4 as explained above, since it is no longer required to form optical wiring section on the upper surface of substrate by conducting optical transmission and reception between the plane type optical emitting/receiving element and end-face type optical emitting/receiving element respectively mounted on the upper and lower surfaces of substrate via the through-hole provided between the upper and lower surfaces of substrate, optical waveguide formed at the lower surface of substrate extending to the end face of the end-face type optical emitting/receiving element from the area just under the through-hole and optical path changing means formed at the end-face of the optical waveguide, even when optical parts are mounted in higher density on the upper surface of substrate and when various electronic parts are further mixed for mounting in higher density, optical wiring can be made between the plane type optical emitting/receiving element and end-face type optical emitting/receiving element in such a manner as not interfering high density mounting of these optical parts and electronic parts. On the contrary, optical parts and electronic parts may be mounted in the density and efficiency higher than that of the related art by using the through hole provided through the upper and lower surfaces of substrate and optical waveguide formed at the lower surface of substrate as the transmission path for optical transmission and reception between the plane type optical emitting/receiving element and end-face type optical emitting/receiving element.

The optical transmitting/receiving method in relation to claim 5 introduces the structure, in the optical transmitting/receiving method in relation to any one of claims 1, 2 and 4, in which a reflection film for reflecting the optical signal transmitted in the through-hole is formed at the internal wall of the through-hole. Therefore, the optical signal transmitted or received between optical emitting/receiving elements not only passes in direct the through-hole but also is reflected by the reflection film at the internal wall of through-hole or the optical signal is propagated through repetition of such reflection by the reflection film. Accordingly, this through-hole sufficiently shows the function as the transmission path for the optical signal transmitted or received between optical emitting/receiving elements.

Moreover, the optical transmitting/receiving method in relation to claim 6 introduces the structure, in the optical transmitting/receiving method in relation to claim 3, that a reflection film for reflecting optical signal propagated in the first and second through-holes is formed at the respective internal walls of the first and second through-holes. Therefore, the optical signal transmitted and received between optical emitting/receiving elements not only passes in direct the first and second through-holes but also is reflected by the reflection film at the internal walls of the first and second through-holes or is propagated through repetition of reflection by this reflection film. Accordingly, these first and second through-holes fully shows the function as the transmission path for the optical signal transmitted or received between the optical emitting/receiving elements.

Moreover, the optical transmitting/receiving method in relation to claim 7 introduces the structure, in the optical transmitting/receiving method in relation to claim 5, that the reflection film is used as clad and the core is formed to be surrounded by the clad for transmission of optical signal. Therefore, attenuation of optical signal can be minimized when the through-hole or the first and second through-holes are used as the transmission path for optical signal to be transmitted and received between optical emitting/receiving elements.

The optical transmitting/receiving method in relation to claim 8 in the optical transmitting/receiving method of claim 3 introduces the structure that the first and second optical path changing means are 45° micro-mirrors formed by processing both end faces of the optical waveguide. Thereby, since the optical signal propagated through the first and second through-holes is incident to the optical waveguide after it is totally reflected in the 90 degrees, while the optical signal propagated through the optical waveguide is incident to the first and second through-holes after it is totally reflected in the 90 degrees, it is no longer required to form a small size mirror at the lower surface of the substrate and thereby the first and second through-holes and optical waveguide in which optical signal transmitting directions are orthogonally crossing by the 45° micro-mirrors formed at both end faces of the optical waveguide are optically connected via the simplified mirror structure.

Moreover, in this case, the 45° micro-mirrors formed at both end faces of the optical waveguide have the trapezoidal cross-sectional view on the lower surface of substrate unlike the case where inverse trapezoidal cross-sectional view is provided on the upper surface of substrate as in the case of related art and therefore the method for conducting mechanical cutting process may be introduced and thereby the manufacturing process can be simplified to realize lower manufacturing cost.

Moreover, the optical transmitting/receiving method in relation to claim 9 in the optical transmitting/receiving method of claim 4 introduces the structure that the optical changing means is the 45° micro-mirror formed by processing the end face of the optical waveguide. Thereby, since the optical signal propagated via the through-hole is incident to the optical waveguide after it is totally reflected in the 90 degrees, while the optical signal propagated via the optical waveguide is incident to the through-hole after it is totally reflected in the 90 degrees, it is no longer required to form the small size mirror at the lower surface of substrate and the through-hole and optical waveguide of which optical signal transmitting directions are orthogonally crossing with each other by the 45° micro-mirror formed at the end face of the optical waveguide are optically connected via the simplified mirror structure.

Moreover, in this case, since the 45° micro-mirror formed at the end face of the optical waveguide has the trapezoidal cross-sectional view on the upper surface of substrate unlike the related art where inverse trapezoidal cross-sectional view is provided on the upper surface of substrate, the method for conducting mechanical cutting process may be used to realize simplified manufacturing process and low manufacturing cost.

Moreover, the optical transmitting/receiving method in relation to claim 10 in the optical transmitting/receiving method in relation to any one of claims 1 to 4 introduces the structure that optical parts are mounted on the substrate. Therefore, when various electronic parts, for example, optical emission drive and receiving amplifying circuit, LSI circuit, inductor, capacitor, resistor are mixed for mounting in higher density of the substrate, optical wiring between a couple of optical emitting/receiving elements may be realized no to interfere the high density mounting of these optical parts and electronic parts. On the contrary, optical parts and electronic parts may be mounted in the density and efficiency higher than that of the related art by using the through-hole provided through the upper and lower surfaces of substrate, or first and second through-holes and an optical waveguide formed at the lower surface of the substrate as the transmission path for optical transmission/reception between a couple of optical emitting/receiving elements.

Moreover, the optical transmitting/receiving method of claim 11 as claimed in either claim 5 or claim 6, introduces the structure that electronic parts are mounted on the substrate.

Moreover, the optical transmitting/receiving apparatus of claim 12 comprises a substrate, a through-hole provided between the upper and lower surfaces of the substrate; and a couple of optical emitting/receiving elements mounted at the upper and lower surfaces of the substrate; and also uses the through-hole as the transmission path for optical transmission and reception between a couple of the optical emitting/receiving elements.

Moreover, the optical transmitting/receiving apparatus of claim 13 comprises a substrate; a through-hole provided between the upper and lower surfaces of the substrate; first plane type optical emitting/receiving element face-down mounted at the upper position of the through-hole on the substrate; and second plane type optical emitting/receiving element face-down mounted at the lower position of the through-hole on the lower surface of the substrate, and also realizes optical transmission and reception between said first plane type optical emitting/receiving element and the second plane type optical emitting/receiving element via the through-hole.

Moreover, the optical transmitting/receiving apparatus comprises a substrate; first and second through-holes respectively provided between the upper and lower surfaces of the substrate; first plane type optical emitting/receiving element face-down mounted at the upper position of the first through-hole on the upper surface of the substrate; second plane type optical emitting/receiving element face-down mounted at the upper position of the second through-hole on the upper surface of the substrate; optical waveguide formed on the lower surface of the substrate and extended from the area at the lower position of the first through-hole to the area at the lower position of the second through-hole; first and second optical path changing means formed respectively at both ends of the optical waveguide, and also realizes optical transmission and reception between the first plane type optical emitting/receiving element and second optical emitting/receiving element via the first through-hole, the first optical path changing means, the optical waveguide, the second optical path changing means and the second through-hole.

Moreover, the optical transmitting/receiving apparatus comprises a substrate; a through-hole provided between the upper and lower surfaces of the substrate; first plane type optical emitting/receiving element face-down mounted at the upper position of the first through-hole on the upper surface of the substrate; end-face type optical emitting/receiving element mounted on the lower surface of the substrate; optical waveguide formed on the lower surface of the substrate and extended from the area at the lower position of the first through-hole to the end face of the end-face type optical emitting/receiving element; and optical path changing means formed at the end face of the optical waveguide in the side of the through-hole, and also realizes optical transmission and reception between the plane type optical emitting/receiving element and the end-face type optical emitting/receiving element via the through-hole, the optical path changing means and the optical waveguide.

BRIEF DESCRIPTION OF THE DRAWINGS

FIG. 1 is a schematic cross-sectional view illustrating an example of the optical transmitting/receiving apparatus of the related art.

FIG. 2 is an enlarged view illustrating the optical waveguide and 45° micro-mirror in the optical transmitting/receiving apparatus of FIG. 1.

FIG. 3 is a diagram illustrating the case where a small size mirror element is used in place of the 45° micro-mirror in the optical transmitting/receiving method of FIG. 1.

DETAILED DESCRIPTION OF THE PREFERRED EMBODIMENTS

The preferred embodiments of the present invention will be explained with reference to the accompanying drawings.
(First Embodiment)

Figure 6:
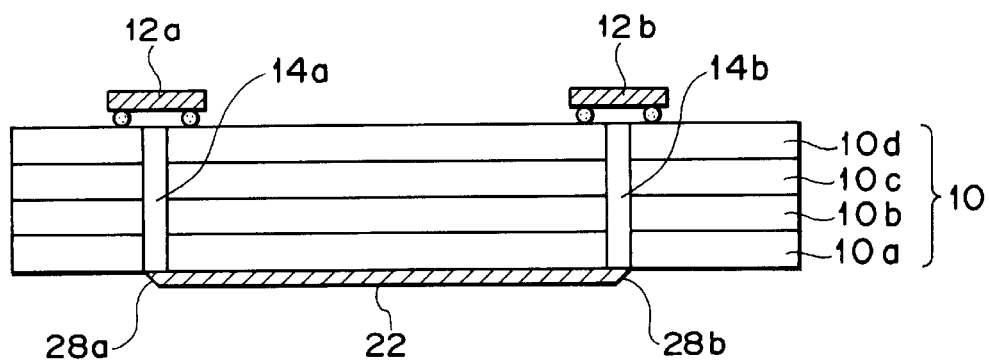
FIG. 6 is a schematic cross-sectional view illustrating the optical transmitting/receiving method in relation to the first embodiment of the present invention.
Figure 7A:
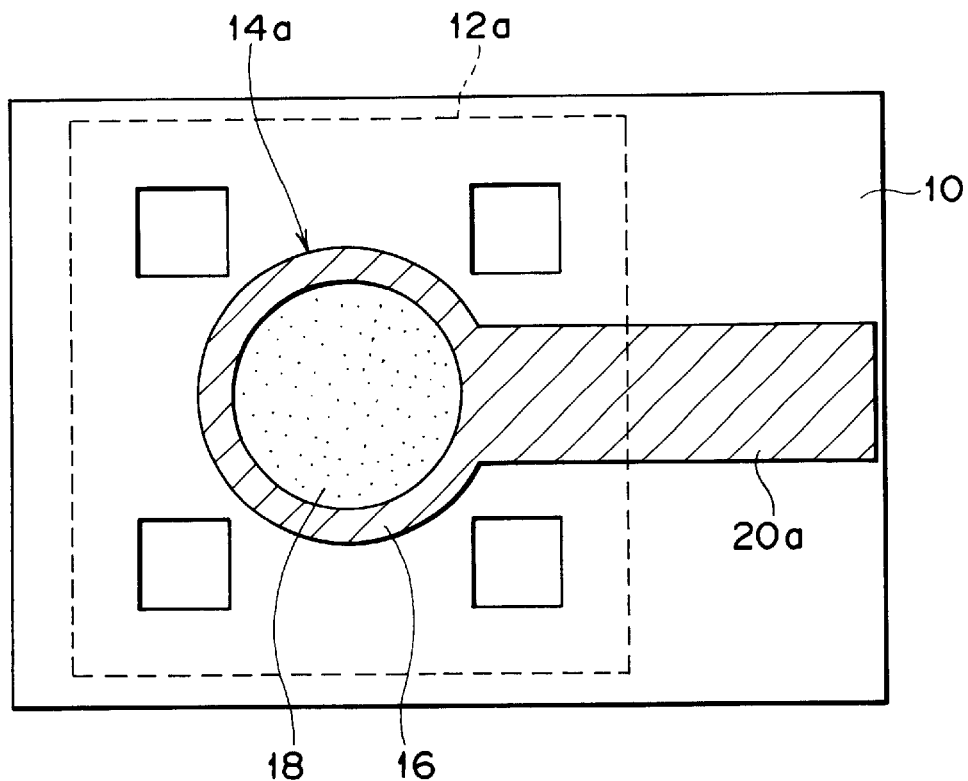
FIGS. 7A and 7B are an enlarged plan view and enlarged cross-sectional view illustrating the through-hole in the optical transmitting/receiving apparatus of FIG. 6.
Figure 7B:
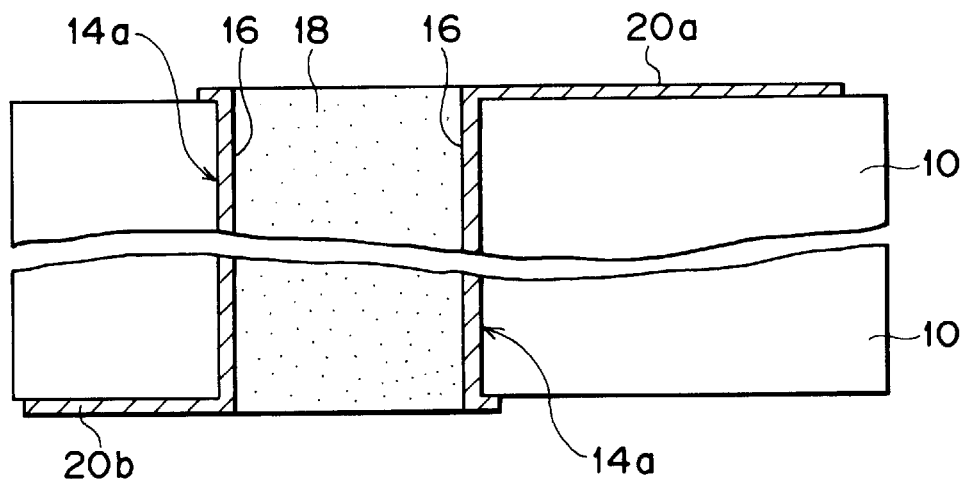
Figure 8:
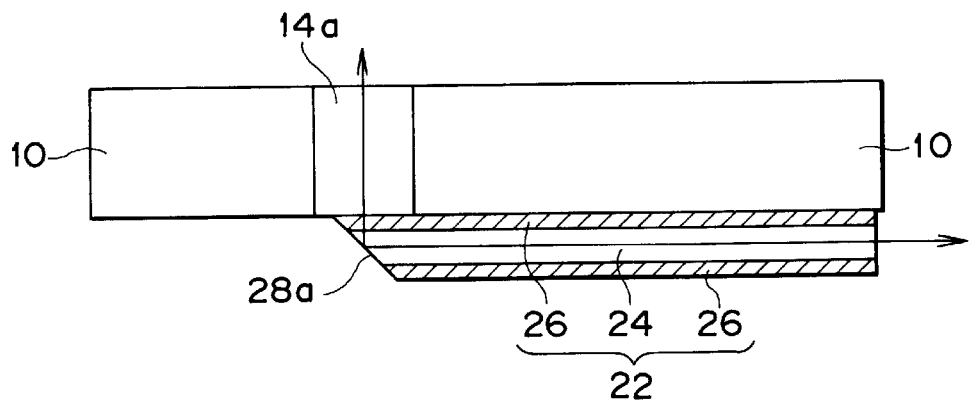
FIG. 8 is an enlarged view illustrating the optical waveguide and 45° micro-mirror in the optical transmitting/receiving apparatus of FIG. 6.
Figure 9:
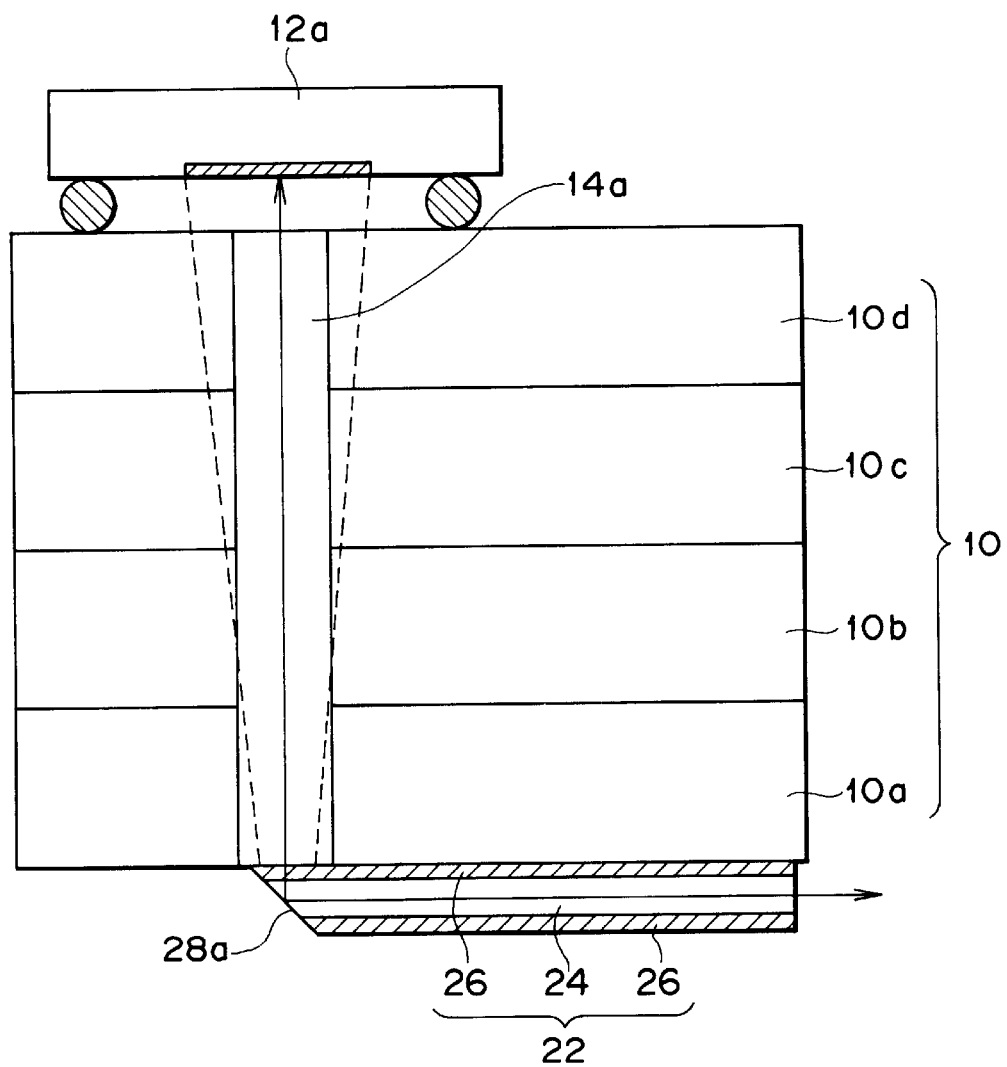
FIG. 9 is a diagram for explaining operation of optical transmitting/receiving apparatus of FIG. 6.

FIG. 6 is a schematic cross-sectional view illustrating an optical transmitting/receiving method in relation to the first embodiment of the present invention. FIGS. 7A and 7B are enlarged plan view and enlarged cross-sectional view illustrating the through-hole in the optical transmitting/receiving system of FIG. 6. FIG. 8 is an enlarged view illustrating the optical waveguide and 45° micro-mirror in the optical transmitting/receiving method of FIG. 6 and FIG. 9 is a diagram for explaining operations of the optical transmitting/receiving method of FIG. 6.

As illustrated in FIG. 6, a couple of plane type optical emitting/receiving elements 12a, 12b are face-down mounted, by the flip chip joining method, namely with the optical emitting/receiving surface directed downward at the upper surface of the multilayer substrate 10 on which the first to fourth insulating layers 10a, 10b, 10c, 10d are sequentially laminated.

Although not illustrated, on the upper surface of the multilayer substrate 10, electronic parts, for example, optical emitting/receiving drive and receiving amplifying circuit, LSI circuit, inductor, capacitor and resistor are mounted, in addition to the plane type optical emitting/receiving elements 12a, 12b, by the flip chip joining method and wire bonding joining method or the like. Moreover, a wiring layer for electrically connecting various electronic parts is formed between the upper and lower surfaces of multilayer substrate 10 and between insulating layers thereof and moreover these wiring layers are connected via the via holes formed to each insulating layer to totally form the multilayer wiring structure as a whole.

Moreover, a couple of through-holes 14a, 14b provided through the upper surface and lower surface of the multilayer substrate 10 are respectively formed at the area just under the center of the optical emitting/receiving surface of a couple of plane type optical emitting/receiving elements 12a, 12b. As illustrated in FIGS. 7A and 7B, in the through-hole 14a, a clad 16 consisting of a conductive layer on which surface the plating process is executed at its internal wall. At the center area of which circumference is surrounded by this clad 16, a core 18 consisting, for example, of transparent polymer resin for optical signal is formed.

Moreover, on the upper surface of multilayer substrate 10, the wiring layer 20a for electrically connecting various electronic parts is formed in connection with the clad 16 at the internal wall of the through-hole 14a. Moreover, also at the lower surface of multilayer substrate 10, the wiring layer 20b is formed to connect the clad 16 of the through-hole 14a. Accordingly, the clad 16 at the internal wall of the through-hole 14a also forms, together with the wiring layers 20a, 20b connected thereto, a part of the multilayer wiring structure of the multilayer substrate 10.

Here, only one through-hole 14a is particularly illustrated in the figure for explanation but the other through-hole 14b is also similar to the through-hole 14a.

Moreover, at the lower surface of the multilayer substrate 10, the optical waveguide 22 extending in straight up to the area just under the other through-hole 14b from the area just under one through-hole 14a is formed. This optical waveguide 22 is formed, as illustrated in FIG. 8, of the core 24 at the center for transmitting optical signal and the clad 26 which is formed of material having refractive index lower than that of the core 24 to surround such core 24.

Moreover, the 45° micro-mirrors 28a, 28b are respectively formed at both end faces of the optical waveguide 22. These 45° micro-mirrors 28a, 28b respectively have the trapezoidal cross-sectional views on the lower surface of the multilayer substrate 10. Thereby, as indicated by the arrow mark in FIG. 8, the optical signal propagated, for example, in the through-hole 14a is incident to the optical waveguide 22 after it is totally reflected in the 90 degrees by the 45° micro-mirror 28a and is then propagated in the core 24 of the optical waveguide 22. In the same manner, the optical signal propagated in the core 24 of the optical waveguide 22 is totally reflected in the 90 degrees by the 45° micro-mirror 28a and is then incident to the through-hole 14a for propagation there-through.

Here, manufacturing method of this optical transmitting/ receiving method of this embodiment will then be briefly explained.

A couple of through-holes 14a, 14b are opened in the same process as the process to open the through-hole to form the multilayer wiring structure in the multilayer substrate 10. With the same process as that to form the wiring layers 20a, 20b of the multilayer wiring structure, a conductive layer is formed at the internal wall of the through-hole 14a and moreover the clad 16 is formed by executing the plating process to the surface of this conductive layer. Thereafter, the through-holes 14a, 14b of which internal walls are covered with the clad 16 is filled with the polymer resin. This resin is then hardened to form the core 18.

The optical waveguide 22 can be formed in direct at the lower surface of the multilayer substrate 10. Both end faces of this optical waveguide 22 are mechanically cut by the dicing technology or the like. In more practical, cutting process is conducted using a diamond saw of which end part is formed in the V-shape in the angle of 90 degrees. Thereby, the 45° micro-mirrors 28a, 28b are respectively formed at both end faces of the optical waveguide 22.

Next, operations of the optical transmitting/receiving method of the present embodiment will then be explained.

For example, the optical signal emitted from the optical emitting surface of the plane type optical emitting/receiving element 12b is then incident to the core of the through-hole 14b located at the area just under the center of the optical emitting surface. The optical signal incident to the core of the through-hole 14b is then propagated by repeating total reflection at the interfaces between the core and clad.

The optical signal propagated in the core of the through-hole 14b is then totally reflected in the 90 degrees by the 45° micro-mirror 28b and is then incident to the core 24 of the optical waveguide 22. The optical signal incident to the core 24 of the optical waveguide 22 is then propagated by repeating the total reflection at the interface of the core 24 and clad 26.

The optical signal propagated in the core 24 of the optical waveguide 22 is totally reflected in the 90 degrees by the 45° micro-mirror 28a and is then incident to the core 18 of the through-hole 14a. The optical signal incident to the core 18 of the through-hole 14a is then propagated by repeating total reflection at the interface between the core 18 and clad 16. The optical signal propagated in the core 18 of the through-hole 14a is then incident to the receiving surface of the plane type optical emitting/receiving element 12a located at the area just above the through-hole 14a.

Propagation of optical signal in the through-holes 14a, 14b in this case will be explained in more practically.

Figure 4:
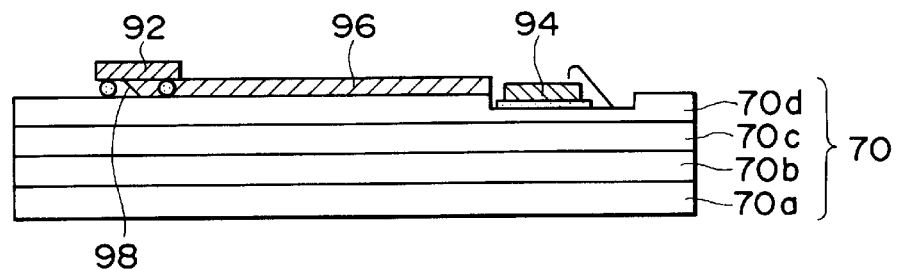
FIG. 4 is a schematic cross-sectional view illustrating the other example of the optical transmitting/receiving apparatus of the related art.

For example, the optical signal propagated in the core 24 of the optical waveguide 22 is totally reflected in the 90 degrees by the 45° micro-mirror 28a and is then incident to the core 18 of the through-hole 14a. However, as illustrated in FIG. 4, when the size of core 24 of optical waveguide 22 is 50 $\mu$m*50, thickness of multilayer substrate 10 is 0.8 mm. When the radiation angle of optical signal totally reflected by the 45° micro-mirror 28a is 10°, radiation of optical signal until it reaches the optical receiving surface of the plane type optical emitting/receiving element 12a has the spreading of about 200 $\mu$m*200 $\mu$m.

Therefore, when the core 18 of through-hole 14a has a larger diameter, the optical signal reaches in direct the optical receiving surface of the plane type optical emitting/ receiving element 12a. However, as illustrated in FIG. 4, since the core 18 of through-hole 14a has a smaller diameter, the optical signal is propagated by repeating the total reflection at the interface between the core 18 and clad 16 of the through-hole 14a and reaches the optical receiving surface of the plane type optical emitting/receiving element 12a as the multimode type signal.

As explained above, the optical signal emitted from the plane type optical emitting/receiving element 12b is transmitted to the plane type optical emitting/receiving element 12a via the through-hole 14b, 45° micro-mirror 28b, optical waveguide 22, 45° micro-mirror 28a and through-hole 14a. In the same manner, the optical signal emitted from the plane type optical emitting/receiving element 12a is transmitted to the plane type optical emitting/receiving element 12b via the through-hole 14a, optical waveguide 22, 45° micro-mirror 28b and through-hole 14b.

In FIG. 8 and FIG. 9, profiles of optical signal propagated in the core 24 of optical waveguide 22 and propagated in the through-hole 14a are indicated with arrow marks as the optical transmission image. This linear optical transmission image is only a convenient indication. Actually, the optical signal incident in the range of the specified critical angle is propagated by repeating total reflection at the interface between the core 24 and clad 26 of the optical waveguide 22 and by repeating total reflection at the interface between the core 18 and clad 16 of the through-hole 14a.

As explained above, according to the optical transmitting/receiving method of the present embodiment, optical transmission and reception between a couple of plane type optical emitting/receiving elements 12a, 12b mounted on the upper surface of multilayer substrate 10 is conducted via the transmission path formed of a couple of through-holes 14a, 14b respectively opened at the area just under the center of the optical emitting/receiving surface of a couple of plane type optical emitting/receiving elements 12a, 12b, optical waveguide 22 extending in straight up to the area just under the other through-hole 14b from the area just under one through-hole 14a and the 45° micro-mirrors 28a, 28b respectively formed at both end faces of this optical waveguide 22. Thereby, since it is no longer required to form the optical wiring section at the upper surface of the multilayer substrate 10, on the occasion of mounting electronic parts, for example, such as optical emitting drive and receiving amplifying circuit, LSI circuit, inductor, capacitor and resistor in addition to optical parts such as couple of plane type optical emitting/receiving elements 12a, 12b on the upper surface of the multilayer substrate 10, such parts may be mounted simultaneously in the density and efficiency higher than that of the related art without any interference by the optical wiring section.

Moreover, since the clad 16 composed of conductive layer of which surface is subjected to the plating process is formed at the internal wall of the through-holes 14a, 14b and the core 18 consisting, for example, of transparent polymer resin for optical signal is formed at the center of which circumference is surrounded by this clad 16, optical transmission and reception between a couple of plane type optical emitting/receiving elements 12a, 12b is conducted not only by the direct transmission of optical signal via these through-holes 14a, 14b, but also by total reflection of signal by the clad 16 at the internal wall of the through-holes 14a, 14b or by repetition of such total reflection. Accordingly, these through-holes 14a, 14b minimizes attenuation of optical signal transmitted or received between a couple of plane type optical emitting/receiving elements 12a, 12b to sufficiently show the function as the transmission path for the optical signal.

Moreover, the clad 16 at the internal wall of the through-holes 14a, 14b is respectively connected to the wiring layers 20a, 20b formed at the upper and lower surfaces of the multilayer substrate 10 to form a part of the multilayer wiring structure in the multilayer substrate 10. Therefore, these through-holes 14a, 14b functions not only as the optical wiring section for transmitting optical signal but also as electrical wiring section to connect various electronic parts. Accordingly, structure of the multilayer substrate 10 forming the multilayer wiring structure and moreover structure of the optical transmitting/receiving method as a whole may be simplified.

Moreover, since the 45° micro-mirrors 28a, 28b are respectively formed at both end faces of the optical waveguide 22, it is no longer required to particularly form a small size mirror and the function as the optical path changing means can be attained with the simplified mirror structure. Moreover, these 45° micro-mirrors 28a, 28b have the trapezoidal cross-sectional views on the lower surface of the multilayer substrate 10, unlike the related art having the inverse trapezoidal cross-sectional views on the upper surface of the multilayer substrate 10. Therefore, the mechanical cutting process may be realized using a diamond saw of which end part is formed in the V-shape having the angle of 90 degrees to simplify the manufacturing process to realize reduction of cost.

(Second Embodiment)

Figure 10:
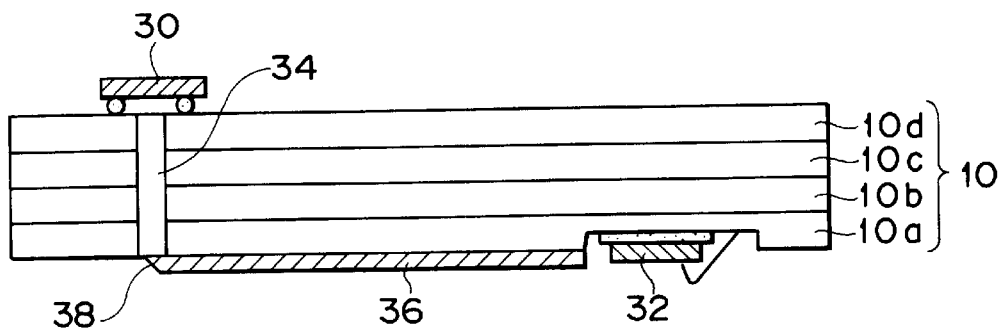
FIG. 10 is a schematic cross-sectional view illustrating the optical transmitting/receiving apparatus in relation to the second embodiment of the present invention.

FIG. 10 is a schematic cross-sectional view illustrating the optical transmitting/receiving method in relation to the second embodiment of the present invention. The enlarged plan view and enlarged cross-sectional view illustrating through-hole in the optical transmitting/receiving method of FIG. 10, enlarged view illustrating the optical waveguide and 45° micro-mirror and a diagram for explaining operation of the optical transmitting/receiving method are basically identical to FIGS. 7A and 7B, FIG. 8 and FIG. 9 for the first embodiment and therefore these figures are not illustrated. Moreover, the elements like those of the structural elements of the optical transmitting/receiving method illustrated in FIG. 6 of the first embodiment are designated by the like reference numerals.

In above first embodiment, a couple of plane type optical emitting/receiving elements 12a, 12b mounted on the upper surface of the multilayer substrate 10 are optically connected via two through-holes 14a, 14b and optical waveguide 22 at the lower surface of multilayer substrate 10, while the optical transmitting/receiving method in relation to the present second embodiment is characterized in that the plane type optical emitting/receiving element mounted on the upper surface of multilayer substrate and the end face type optical emitting/receiving element mounted on the lower surface of multilayer substrate are optically connected via the through-hole and optical waveguide at the lower surface of multilayer substrate.

Namely, as illustrated in FIG. 10, the plane type optical emitting/receiving element 30 is face-down mounted, using the flip chip joining method, namely with the optical emitting/receiving surface directed downward on the upper surface of the multilayer substrate 10 on which the first to fourth insulating layers 10a, 10b, 10c, 10d are sequentially laminated. Moreover, at the bottom surface of recessed area formed at the lower surface of the multilayer substrate 10, the end face type optical emitting/receiving element 32 is mounted using the wire bonding joining method. These plane type optical emitting/receiving element 30 and end face type optical emitting/receiving element 32 are forming a couple of optical emitting/receiving elements.

Here, like the first embodiment, electronic parts, for example, such as optical emitting drive and receiving amplifying circuit, LSI circuit, inductor, capacitor and resistor are also mounted, in addition to the plane type optical emitting/receiving element 30, on the upper surface of the multilayer substrate 10 and moreover the wiring layer for electrically connecting various electronic parts is also formed on the upper and lower surfaces of the multilayer substrate 10 and between respectively insulating layers and moreover these wiring layers are connected via the via holes formed on each insulating layer to form the multilayer wiring structure as a whole.

Moreover, a through-hole 34 provided through the upper and lower surfaces of the multilayer substrate 10 is formed at the area just under the center of the optical emitting/receiving surface of the plane type optical emitting/receiving element 30. As in the case of illustration in FIG. 7A and FIG. 7B, the clad consisting of conductive layer of which surface is plated is formed at the internal wall of the through-hole 34 and the core consisting of the polymer resin which is transparent, for example, for optical signal is also formed at the center surrounded by the clad in the periphery. Moreover, the clad at the internal wall of this through-hole 34 forms a part of the multilayer wiring structure of the multilayer substrate 10.

At the lower surface of the multilayer substrate 10, the optical waveguide 36 extending linearly up to the end face of the plane type optical emitting/receiving element 32 from the area just under the through-hole 34 is formed. As in the case of FIG. 3, this optical waveguide 36 is formed of the core at the center to transmit optical signal and the clad surrounding the core and consisting of the material having refractive index lower than that of the core.

Moreover, the 45° micro-mirror 38 is formed at the end face in the side of the through-hole 34 of this optical waveguide 36. This 45° micro-mirror 38 has a trapezoidal cross-sectional view on the lower surface of the multilayer substrate 10. The optical signal propagated, for example, via the through-hole 34 is the totally reflected in the 90 degrees by the 45° micro-mirror 38 and is then incident to the optical waveguide 36 for propagation in the core of the optical waveguide 36. In the same manner, the optical signal propagated in the core of the optical waveguide 36 is totally reflected in the 90 degrees by the 45° micro-mirror 38 and is then incident to the through-hole 34 for propagation in the through-hole 34.

Here, manufacturing method of the optical transmitting/receiving method of the present embodiment will then be explained briefly.

The through-hole 34 may be formed in the same manner as the method to form a couple of through-holes 14a,14b in the first embodiment. Moreover, the optical waveguide 36 and 45° micro-mirror 38 provided at one end thereof may also be formed in the same manner as the method to form the optical waveguide 22 and the 45° micro-mirrors 28a, 28b at both ends thereof in the first embodiment.

Next, operations of the optical transmitting/receiving method of the present embodiment will be explained.

For example, the optical signal emitted from the optical emitting surface of the plane type optical emitting/receiving element 30 is incident to the core of the through-hole 34 located at the area just under the center of the optical emitting surface. The optical signal incident to the core of this through-hole 34 is then propagated by repeating the total reflection at the interface between the core and clad.

The optical signal propagated in the core of the through-hole 34 is totally reflected in the 90 degrees by the 45° micro-mirror 38 and is then incident to the core of optical waveguide 36. The optical signal incident to the core of this optical waveguide 36 is propagated by repeating total reflection at the interface between the core and clad of optical waveguide 36. The optical signal propagated in the core of the optical waveguide 36 is then incident to the optical receiving surface of the end face type optical emitting/receiving element 32.

As explained above, the optical signal emitted from the plane type optical emitting/receiving element 30 is transmitted to the end face type optical emitting/receiving element 32 via the through-hole 34, 45° micro-mirror 38 and optical waveguide 36. In the same manner, the optical signal emitted from the end face type optical emitting/receiving element 32 is also transmitted to the plane type optical emitting/receiving element 30 via the optical waveguide 36, 45° micro-mirror 38 and through-hole 34.

As explained above, according to the optical transmitting/receiving method of the present embodiment, optical transmission and reception between a couple of plane type optical emitting/receiving element 30 and end face type optical emitting/receiving element 32 mounted respectively on the upper and lower surfaces of the multilayer substrate 10 can be realized via the transmission path consisting of the through-hole 34 opened at the area just under the center of the optical receiving surface of the plane type optical emitting/receiving element 30, optical waveguide 36 extending linearly up to the end face of the plane type optical emitting/receiving element 32 from the area just under the through-hole 34 and the 45° micro-mirror 38 formed at the end face in the side of the through-hole 34 of the optical waveguide 36.

Therefore, since it is no longer required to form the optical wiring section at the upper surface of the multilayer substrate 10, electronic parts, for example, optical emitting drive and receiving amplifying circuit, LSI circuit, inductor, capacitor and resistor may be mounted simultaneously with optical parts such as plane type optical emitting/receiving element 30 on the upper surface of the multilayer substrate 10 with density and efficiency higher than that of the related art without interference by the optical wiring section.

Moreover, as in the case of the first embodiment explained above, since the clad consisting of the conductive layer of which surface is plated is formed at the internal wall of the through-hole 34 and the core consisting of polymer resin which is transparent, for example, to optical signal is formed at the center surrounded in the periphery by the clad, the through-hole 34 minimizes attenuation of optical signal transmitted and received between a couple of plane type optical emitting/receiving element 30 and end face type optical emitting/receiving element 32 to sufficiently and stably show the function as the transmission path of optical signal. Moreover, since the clad at the internal wall of through-hole 34 forms a part of the multilayer wiring structure of the multilayer substrate 10, this through-hole 34 functions as the optical wiring section for transmitting the optical signal and also functions as the electrical wiring section for connecting various electrical elements. Thereby, the structure of the multilayer substrate 10 forming the multilayer wiring structure, and moreover the structure of the optical transmitting/receiving method as a whole can be much simplified.

Moreover, since the 45° micro-mirror 38 is formed at the end face of the optical waveguide 36, it is no longer required to particularly provide a small size mirror element and therefore the function of the optical path changing means can be realized with simplified structure. In addition, since this 45° micro-mirror 38 has the trapezoidal cross-sectional view on the lower surface of the multilayer substrate 10, mechanical cutting process may be conducted as in the case of the first embodiment and thereby the manufacturing process can be simplified to realize cost reduction.

(Third Embodiment)

Figure 11:
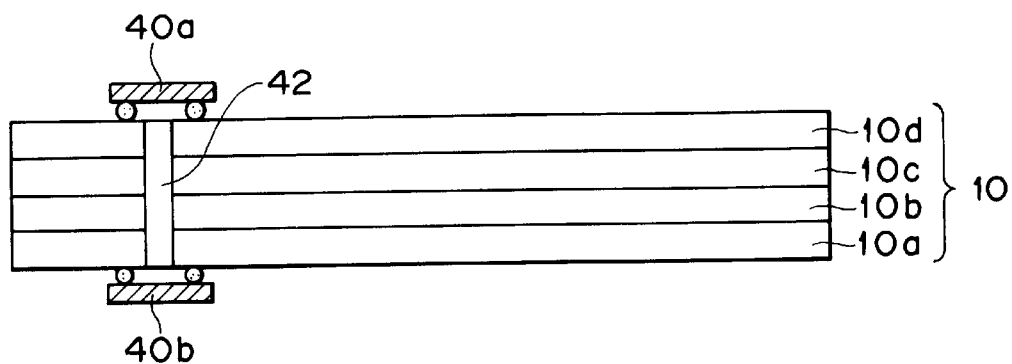
FIG. 11 is a schematic cross-sectional view illustrating the optical transmitting/receiving apparatus in relation to the third embodiment of the present invention.

FIG. 11 is a schematic cross-sectional view illustrating the optical transmitting/receiving method in relation to the third embodiment of the present invention. Since the enlarged plan view and enlarged cross-sectional view illustrating the through-hole in the optical transmitting/receiving system of FIG. 11 are basically identical to FIG. 7A and 7B in the first embodiment, these figures are not illustrated here. Moreover, the elements like the structural elements of the optical transmitting/receiving method illustrated in FIG. 1 of the first embodiment are designated by the like reference numerals and the same explanation is omitted here.

In the first embodiment explained above, a couple of plane type optical emitting/receiving elements 12a, 12b mounted on the upper surface of the multilayer substrate 10 are optically connected via the tow through-holes 14a, 14b and optical waveguide 22, etc. at the lower surface of the multilayer substrate 10, while the optical transmitting/receiving system in relation to the present embodiment is characterized in that the plane type optical emitting/receiving element mounted on the upper surface of multilayer substrate and the plane type optical emitting/receiving element mounted on the lower surface thereof can be optically connected via the through-hole.

Namely, as illustrated in FIG. 11, the plane type optical emitting/receiving element 40a is face-down mounted by the flip chip joining method, namely with the optical emitting/receiving surface directed downward, on the upper surface of the multilayer substrate 10 on which the first to fourth insulating layers 10a, 10b, 10c, 10d are sequentially laminated. Moreover, on the lower surface of the multilayer substrate 10, the plane type optical emitting/receiving element 40b is face-down mounted by the flip chip joining method, namely with the optical emitting/receiving surface directed upward. These plane type optical emitting/receiving elements 40a, 40b are forming a couple of optical emitting/receiving elements.

Like the first embodiment explained above, the electronic parts, for example, such as optical emitting drive and receiving amplifying circuit, LSI circuit, inductor, capacitor and resistor are mounted in addition to the plane type optical emitting/receiving element 40a on the upper surface of the multilayer substrate 10 and moreover wiring layers for connecting various electronic parts are also formed on the upper and lower surfaces of the multilayer substrate and between respectively insulating layers and in addition these wiring layers are connected through the via holes formed on each insulating layer to form the multilayer wiring structure as a whole.

Moreover, at the area just under the center of the optical emitting/receiving surface of the plane type optical emitting/receiving element 40a, a through-hole 42 provided through the upper and lower surfaces of the multilayer substrate 10 is formed. The optical emitting/receiving surface of the plane type optical emitting/receiving element 40b is located at the area just under the center of this through-hole 42 with its optical emitting/receiving surface directed toward the through-hole 42.

Moreover, as illustrated in FIG. 7A and FIG. 7B, at the internal wall of this through-hole 42, the clad consisting of conductive layer of which surface is subjected to the plating is formed and the core consisting of polymer resin which is transparent, for example, for optical signal is also formed at the center surrounded by the clad at the periphery. Moreover, the clad at the internal wall of through-hole 42 forms a part of the multilayer wiring section of the multilayer substrate 10.

Here, a method for manufacturing the optical transmitting/receiving method of the present embodiment will be briefly explained. The through-hole 42 may be formed with the method same as that explained to form two through-holes 14a, 14b in the first embodiment.

Operation of the optical transmitting/receiving method of the present invention will be explained next.

For example, the optical signal emitted from the optical emitting surface of the plane type optical emitting/receiving element 40a is incident to the core of the through-hole 42 located at the area just under the center of the optical emitting surface. The optical signal incident to the core of this through-hole 42 is then propagated by repeating total reflection at the interface between the core and clad. The optical signal propagated in the core of the through-hole 42 is then incident to the optical receiving surface of the plane type optical emitting/receiving element 40b.

As explained above, the optical signal emitted from the plane type optical emitting/receiving element 40a is transmitted to the plane type optical emitting/receiving element 40b via the through-hole 42. In the same manner, the optical signal emitted from the plane type optical emitting/receiving element 40b is also transmitted to the plane type optical emitting/receiving element 40a via the through-hole 42.

As explained above, according to the optical transmitting/receiving method in relation to the present invention, optical transmission and reception between a couple of plane type optical emitting/receiving elements 40a, 40b mounted at the upper and lower surfaces of the multilayer substrate 10 may be realized through the transmission path consisting of the through-hole 42 opened at the area just under the center of the optical emitting/receiving surface of the plane type optical emitting/receiving element 40a and also opened at the area just above the center of the optical emitting/receiving surface of the plane type optical emitting/receiving element 40b. Thereby, it is no longer required to form the optical wiring section at the upper surface of the multilayer substrate 10 and therefore, on the occasion of mounting electronic parts, for example, such as optical emitting drive and receiving amplifying circuit, LSI circuit, inductor, capacitor and resistor on the upper surface of multilayer substrate 10 simultaneously with the optical parts such as plane type optical emitting/receiving element 40a, such parts may be mounted in the density and efficiency higher than that of the related art without interference by optical wiring section.

Moreover, like the first embodiment, since the clad consisting of conductive layer to which the plating process is conducted at the surface is formed at the internal wall of the through-hole 42 and the core consisting of polymer resin which is transparent, for example, for optical signal is formed at the center surrounded by clad at the periphery, this through-hole 42 minimizes attenuation of optical signal transmitted and received between a couple of plane type optical emitting/receiving elements 40a, 40b and shows sufficient and stable function as the transmission path for optical signal. In addition, since the clad at the internal wall of the through-hole 42 forms a part of the multilayer wiring structure of multilayer substrate 10, this through-hole 42 functions not only as the optical wiring section to transmit optical signal but also as electrical wiring section to connect various electronic parts. Accordingly, the structure of multilayer substrate 10 forming the multilayer wiring structure and moreover the structure of the optical transmitting/receiving method as a whole can be simplified.

In the first to third embodiments, the clad consisting of conductive layer to which the plating is conducted at the surface is formed at the internal wall of the through-holes 14a, 14b, 34, 42 and the core consisting, for example, of polymer resin is also formed at the center surrounded by the clad at its periphery, but it is also possible that the center is not filled with polymer resin and is maintained in the hollow condition. In this case, the optical signal incident to the through-holes 14a, 14b, 34, 42 is the propagated using the air as medium in place of polymer resin.

[Typical Embodiment]

The typical embodiment of the present invention will then be explained with reference to the accompanying drawings.

Figure 13:
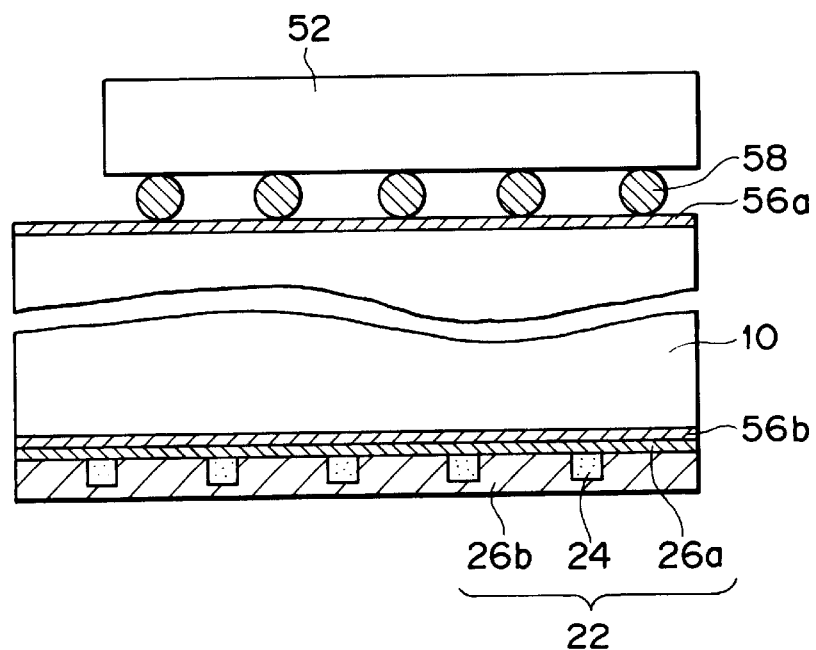
FIG. 13 is a diagram for explaining relationship among the optical wiring section and electronic connecting section and mounting of electronic parts in the optical transmitting/receiving apparatus of FIGS. 12A to 12C.
Figure 12A:
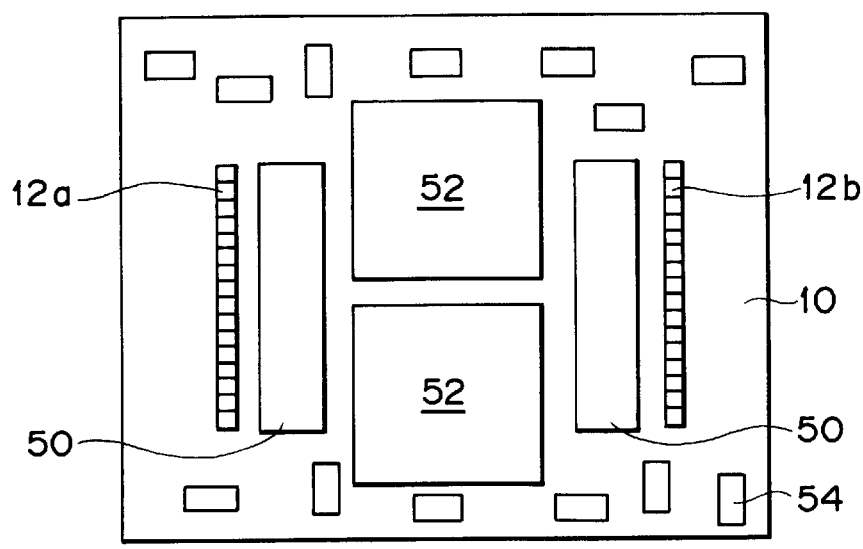
FIGS. 12A to 12C are a schematic plan view, a schematic cross-sectional view and a schematic bottom view illustrating the optical transmitting/receiving apparatus in relation to the typical embodiment corresponding to the first embodiment of the present invention.
Figure 12B:
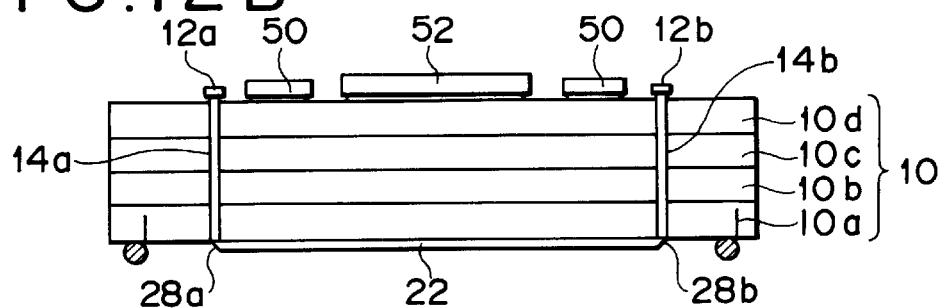
Figure 12C:
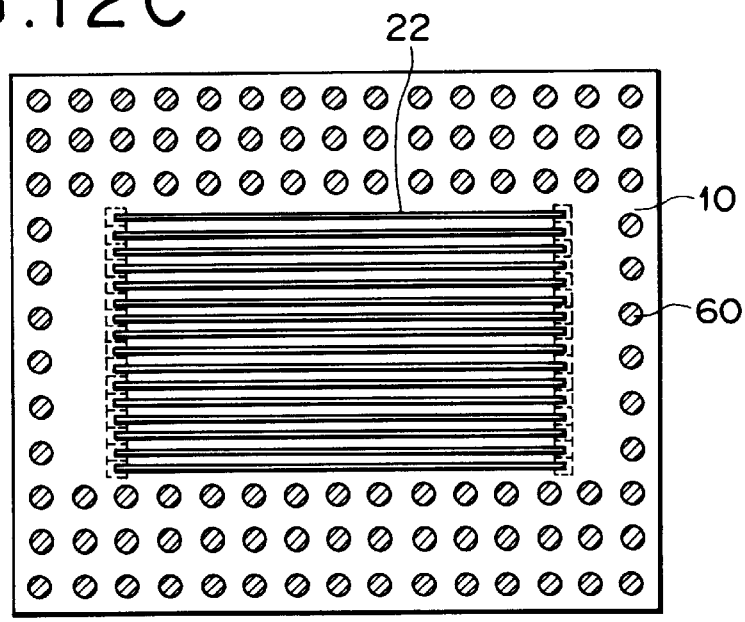

FIGS. 12A, 12B and 12C are respectively schematic plan view, schematic cross-sectional view and schematic bottom view illustrating the optical transmitting/receiving method of the typical embodiment of the present invention, while FIG. 13 is a diagram for explaining relationship between the optical wiring section and electrical connection section and mounting of electronic parts in the optical transmitting/ receiving system of FIGS. 12A to 12C. The elements like the structural elements of the optical transmitting/receiving method of FIG. 6 of the first embodiment are designated by the like reference numerals.

The optical transmitting/receiving method in relation to the present typical embodiment corresponds to the optical transmitting/receiving method of the first embodiment explained above. In more practical, such system is formed as an MPU module using a high speed digital signal of 1 GHz as the optical signal in the LSIs and meanwhile using a very higher digital signal of 2.5 GHz or higher as the optical signal.

As illustrated in FIGS. 12A and 12B, a plurality of plane type optical emitting/receiving elements 12a are arranged like a matrix on the upper surface of the multilayer substrate 10 on which the first to fourth insulating layers 10a, 10b, 10c, 10d are sequentially laminated and a plurality of plane type optical emitting/receiving elements 12b are arranged like a matrix against the matrix arrangement of such plane type optical emitting/receiving elements 12a. Namely, a plurality of plane type optical emitting/receiving elements 12a, 12b arranged in the matrix shape are forming a pair with each other. A plurality of plane type optical emitting/ receiving elements 12a, 12b forming a pair is face-down mounted using the flip chip joining method, namely with the optical emitting/receiving surface directed downward.

In addition, the electronic parts, for example, such as optical emitting drive and receiving amplifying circuit 50, LSI circuit 52, LCR parts 54 are mounted, in addition to a plurality of plane type optical emitting/receiving elements 12a, 12b by the flip chip joining method and wire bonding joining method on the upper surface of the multilayer substrate 10. Namely, as illustrated in FIG. 13, the electrical wiring section 56a consisting of the wiring layer for electrically connecting various electronic parts is formed on the upper surface of the multilayer substrate 10 and the LSI circuit 52, for example, is flip chip mounted via the flip chip bump 58 formed at the bottom surface on the electrical wiring section 56a.

Moreover, on the lower surface of the multilayer substrate 10, the electrical wiring section 56b is also formed. In addition, although not illustrated, the wiring layer is also formed between the first to fourth insulating layers 10a, 10b, 10c, 10d of the multilayer substrate 10 and these wiring layers and the electrical wiring sections 56a, 56b at the upper and lower surfaces of the multilayer substrate 10 are connected through the via holes formed to the first to fourth insulating layers 10a, 10b, 10c, 10d, forming the multilayer wiring structure as a whole.

At the area just under the center of optical emitting/ receiving surface of a plurality of plane type optical emitting/receiving elements 12a, a plurality of through-holes 14a provided through the upper and lower surfaces of the multilayer substrate 10 are respectively formed and moreover a plurality of through-holes 14b are also formed at the area just under the optical emitting/receiving surface of a plurality of plane type optical emitting/receiving elements 12b. Like the case illustrated in FIG. 7A and FIG. 7B, at the internal wall of these through-holes 14a, 14b, the clad consisting of conductive layer of which surface is subjected to the plating process is formed and the core consisting of polymer resin which is transparent, for example, to the optical signal is also formed to the center surrounded by clad at the periphery. In addition, the clad of the internal wall of these through-holes 14a, 14b forms a part of the multilayer wiring structure of the multilayer substrate 10.

As illustrated in FIG. 12B and FIG. 12C, the optical waveguides 22 of a plurality of lines extending linearly up to the area just under a plurality of through-holes 14b in the other side from the area just under a plurality of through-holes 14a in one side are formed in parallel at the lower surface of the multilayer substrate 10. As illustrated in FIG. 8, the optical waveguides 22 of a plurality of lines are formed of the first clad layer 26a formed on the electrical wiring section 56b at the lower surface of multilayer substrate 10, the core 24 formed in parallel in a plurality of lines on this first clad layer 26a and the second clad layer 26b covering these cores 24.

Moreover, as illustrated in FIG. 12B, the 45° micromirrors 28a, 28b are respectively formed at both end faces of the optical wave guides 22 formed in parallel in a plurality of lines. These 45° micro-mirrors 28a, 28b respectively have the trapezoidal cross-sectional views on the lower surface of the multilayer substrate 10.

In addition, as illustrated in FIGS. 12B and 12C, at the lower surface of the multilayer substrate 10, a solder ball 60 to mount BGA (Ball Grid Array) on the mother board is arranged in the form of matrix to the area except for the area where the optical waveguides are formed in parallel in a plurality of lines.

As explained above, according to the present typical embodiment, since a plurality of plane type optical emitting/ receiving elements 12a, 12b forming a pair arranged like a line with each other on the upper surface of the multilayer substrate 10 are respectively connected optically via the through-holes 14a, 14b and the optical waveguide 22 at the lower surface of the multilayer substrate 10, it is no longer required to form the optical wiring section at the upper surface of the multilayer substrate 10 and moreover when the LSI circuit 52, for example, is flip-chip mounted via the flip-chip bump 58 on the electrical wiring section 56a at the upper surface of the multilayer substrate 10, it is possible to avoid the mixed mounting of the optical wiring section such as optical waveguide 106 and electronic connecting section of electronic parts such as LSI circuit 102 in a higher density, for example, which can be seen in the related art that a plurality of flip chip bumps 104 are held between the optical waveguides 106 of a plurality of lines as in the case of the related art illustrated in FIG. 13, a degree of freedom for layout of the electronic parts such as optical emitting drive and receiving amplifying circuit 50, LSI circuit 52 and LCR part 54 can be increased and these can be mounted in the density and efficiency higher than that of the related art.

Therefore, signal transmission of comparatively short distance between a plurality of the plane type optical emitting/receiving elements 12a, 12b forming a pair may be realized through the optical wiring section using the through-holes 14a, 14b and optical waveguide 22 at the lower surface of the multilayer substrate 10. Thereby, it is also possible to realize a small size and light weight apparatus which enables elimination of delay by electrical wiring and crosstalk due to high speed and high density signal wirings.

Figure 5:
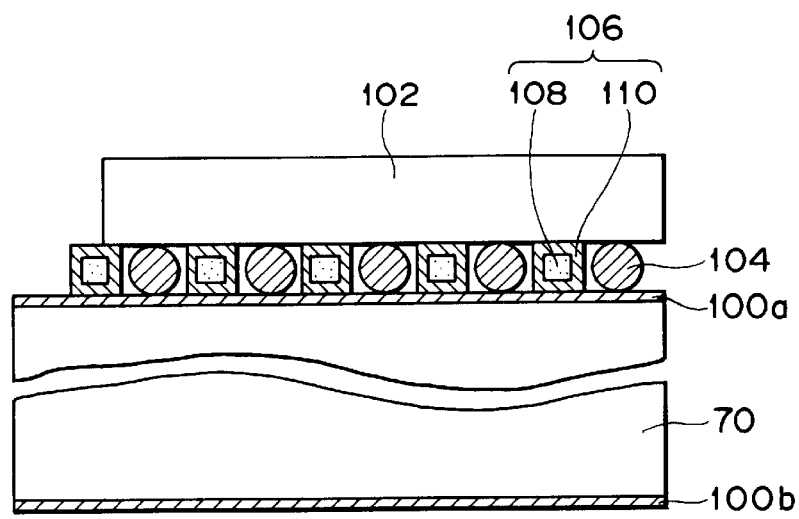
FIG. 5 is a schematic cross-sectional view illustrating the optical transmitting/receiving apparatus mounting the mixed LSI circuits of the related art.

Unlike the related art as illustrated in FIG. 5, it is no longer required to cut the clad 110 of the optical waveguide 106 to expose a part of the surface of the electrical wiring section 100a at the time of flip-chip mounting the LSI circuit 102, for example, on the electrical wiring section 100a via the flip-chip bump 104 and thereby the optical waveguide 22 can be arranged freely at the lower surface of the multilayer substrate 10. Accordingly, reliability of optical waveguide 22 and moreover reliability of MPU module can be improved to realize reduction in cost by simplifying the manufacturing process.

What is claimed is:

1. An optical transmitting/receiving method, comprising:
   providing a substrate;
   providing an optical waveguide formed on a surface of said substrate including a substantially 45° micro-mirror formed by processing an end face of said optical waveguide, said micro-mirror giving said optical waveguide a trapezoidal cross-section with the base of said trapezoidal cross-section being formed on the surface of the substrate;
   providing a through-hole between the upper and lower surfaces of said substrate;
   providing plural optical emitting/receiving elements mounted at the upper and lower surfaces of said substrate; and
   forming, using said through-hole, a transmission path for optical transmission and reception between the optical emitting/receiving elements.

2. An optical transmitting/receiving method, comprising:
   providing a substrate;
   providing an optical waveguide formed on a surface of said substrate including a substantially 45° micro-mirror formed by processing an end face of said optical waveguide, said micro-mirror giving said optical waveguide a trapezoidal cross-section with the base of said trapezoidal cross-section being formed on the surface of the substrate;
   providing a through-hole provided between the upper and lower surfaces of said substrate;
   providing a first plane type optical emitting/receiving element face-down mounted at the upper position of said through-hole on said substrate;
   providing a second plane type optical emitting/receiving element face-down mounted at the lower position of said through-hole on the lower surface of said substrate; and
   realizing optical transmission and reception between said first plane type optical emitting/receiving element and said second plane type optical emitting/receiving element via said through-hole.

3. An optical transmitting/receiving method, comprising:
   providing a substrate;
   providing a through-hole provided between the upper and lower surfaces of said substrate;
   providing a first plane type optical emitting/receiving element face-down mounted at the upper position of said first through-hole on the upper surface of said substrate;
   providing an end-face type optical emitting/receiving element mounted on the lower surface of said substrate;
   providing an optical waveguide formed on the lower surface of said substrate and extended from the area at the lower position of said through-hole to the end face of said end-face type optical emitting/receiving element;
   providing optical path changing means formed at the end face of said optical waveguide in the side of said through-hole; and
   realizing optical transmission and reception between said plane type optical emitting/receiving element and said end-face type optical emitting/receiving element via said through-hole, said optical path changing means and said optical waveguide;
   wherein said optical path changing means includes a substantially 45° micro-mirror formed by processing an end face of said optical waveguide, said micro-mirror giving said optical waveguide a trapezoidal cross-section with the base of said trapezoidal cross-section being formed on the surface of the substrate.

4. An optical transmitting/receiving method as claimed in claim 1 or 2 or 3, wherein a reflection film for reflecting the light beam transmitted within said through-hole is formed at the internal wall of said through-hole.

5. An optical transmitting/receiving method as claimed in claim 4, wherein said reflection film is used as clad and core for optical transmission surrounded by said clad is also formed.

6. An optical transmitting/receiving method as claimed in claim 4, wherein electronic parts are mounted on said substrate.

7. An optical transmitting/receiving method, comprising:
   providing a substrate;
   providing first and second through-holes respectively between the upper and lower surfaces of said substrate;
   providing a first plane type optical emitting/receiving element face-down mounted at the upper position of said first through-hole on the upper surface of said substrate;
   providing a second plane type optical emitting/receiving element face-down mounted at the upper position of said second through-hole on the upper surface of said substrate;
   providing an optical waveguide formed on the lower surface of said substrate and extended from the area at the lower position of said first through-hole to the area at the lower position of said second through-hole;
   providing first and second optical path changing means formed respectively at both ends of said optical waveguide; and
   realizing optical transmission and reception between said first plane type optical emitting/receiving element and said second optical emitting/receiving element via said first through-hole, said first optical path changing means, said optical waveguide, said second optical path changing means and said second through-hole;
   wherein said first and second optical path changing means each include a substantially 45° micro-mirror formed by processing an end face of said optical waveguide, said micro-mirror giving said optical waveguide a trapezoidal cross-section with the base of said trapezoidal cross-section being formed on the surface of the substrate.

8. An optical transmitting/receiving method as claimed in any of claims 1, 2, 3 or 7, wherein electronic parts are mounted on said substrate.

9. An optical transmitting/receiving method as claimed in claim 7, wherein a reflection film for reflecting the light transmitted within said first and second through-holes is formed at the respective internal walls of said first and second through-holes.

10. An optical transmitting/receiving apparatus, comprising:
   a substrate;
   an optical waveguide formed on a surface of said substrate including a substantially 45° micro-mirror formed by processing an end face of said optical waveguide, said micro-mirror giving said optical waveguide a trapezoidal cross-section with the base of said trapezoidal cross-section being formed on the surface of the substrate;
   a through-hole provided between the upper and lower surfaces of said substrate; and
   plural optical emitting/receiving elements mounted at the upper and lower surfaces of said substrate;
   wherein said through-hole forms a transmission path for optical transmission and reception between a couple of said optical emitting/receiving elements.

11. An optical transmitting/receiving apparatus, comprising:
   a substrate;
   an optical waveguide formed on a surface of said substrate including a substantially 45° micro-mirror formed by processing an end face of said optical waveguide, said micro-mirror giving said optical waveguide a trapezoidal cross-section with the base of said trapezoidal cross-section being formed on the surface of the substrate;
   a through-hole provided between the upper and lower surfaces of said substrate;
   a first plane type optical emitting/receiving element face-down mounted at the upper position of said through-hole on said substrate; and
   a second plane type optical emitting/receiving element face-down mounted at the lower position of said through-hole on the lower surface of said substrate,
   wherein optical transmission and reception is realized between said first plane type optical emitting/receiving element and said second plane type optical emitting/receiving element via said through-hole.

12. An optical transmitting/receiving apparatus, comprising:
   a substrate;
   first and second through-holes respectively provided between the upper and lower surfaces of said substrate;
   a first plane type optical emitting/receiving element face-down mounted at the upper position of said first through-hole on the upper surface of said substrate;
   a second plane type optical emitting/receiving element face-down mounted at the upper position of said second through-hole on the upper surface of said substrate;
   an optical waveguide formed on the lower surface of said substrate and extended from the area at the lower position of said first through-hole to the area at the lower position of said second through-hole; and
   first and second optical path changing means formed respectively at both ends of said optical waveguide,
   wherein optical transmission and reception is realized between said first plane type optical emitting/receiving element and second optical emitting/receiving element via said first through-hole, said first optical path changing means, said optical waveguide, said second optical path changing means and said second through-hole,
   wherein said first and second optical path changing means each include a substantially 45° micro-mirror formed by processing an end face of said optical waveguide, said micro-mirror giving said optical waveguide a trapezoidal cross-section with the base of said trapezoidal cross-section being formed on the surface of the substrate.

13. An optical transmitting/receiving apparatus, comprising:
   a substrate;
   a through-hole provided between the upper and lower surfaces of said substrate;
   a first plane type optical emitting/receiving element face-down mounted at the upper position of said through-hole on the upper surface of said substrate;
   an end-face type optical emitting/receiving element mounted on the lower surface of said substrate;
   an optical waveguide formed on the lower surface of said substrate and extended from the area at the lower position of said through-hole to the end face of said end-face type optical emitting/receiving element; and
   optical path changing means formed at the end face of said optical waveguide in the side of said through-hole,
   wherein optical transmission and reception is realized between said plane type optical emitting/receiving element and said end-face type optical emitting/receiving element via said through-hole, said optical path changing means and said optical waveguide,
   wherein said optical path changing means includes a substantially 45° micro-mirror formed by processing an end face of said optical waveguide, said micro-mirror giving said optical waveguide a trapezoidal cross-section with the base of said trapezoidal cross-section being formed on the surface of the substrate.

* * * * *